United States Patent [19]

Okamura

[11] Patent Number: 5,784,324
[45] Date of Patent: Jul. 21, 1998

[54] SINGLE-CHIP MEMORY SYSTEM HAVING A MULTIPLE BIT LINE STRUCTURE FOR OUTPUTTING A PLURALITY OF DATA SIMULTANEOUSLY

[75] Inventor: Yoshifumi Okamura, Tokyo, Japan

[73] Assignee: NEC Corporation, Tokyo, Japan

[21] Appl. No.: 806,667

[22] Filed: Feb. 26, 1997

[30] Foreign Application Priority Data

Feb. 28, 1996 [JP] Japan .................................. 8-041393

[51] Int. Cl.$^6$ .................................................. G11C 7/00
[52] U.S. Cl. ........................... 365/207; 365/205; 327/56
[58] Field of Search ........................... 365/205, 208, 365/207, 189.11, 189.09; 327/51, 52, 53, 56

[56] References Cited

U.S. PATENT DOCUMENTS

5,483,489 1/1996 McClure .................................. 365/205
5,526,314 6/1996 Kumar .................................... 365/205

Primary Examiner—Vu A. Le
Attorney, Agent, or Firm—Whitham, Curtis, Whitham & McGinn

[57] ABSTRACT

To make a memory system smaller, a memory system includes a plurality of memory cell arrays including a plurality of pairs of bit lines, a plurality of first data amplifiers for amplifying data of corresponding pairs of bit lines, a reference voltage circuit for outputting a reference voltage level, and a plurality of second amplifiers for receiving an output of the corresponding first data amplifier and the reference voltage level, for judging which voltage level is higher between the output of the corresponding first data amplifier and the reference voltage level, and for amplifying the voltage level being higher.

27 Claims, 9 Drawing Sheets

SINGLE-CHIP MEMORY SYSTEM HAVING A MULTIPLE BIT LINE STRUCTURE FOR OUTPUTTING A PLURALITY OF DATA SIMULTANEOUSLY

BACKGROUND OF THE INVENTION

The present invention generally relates to a memory system having a multiple bit line structure, and more particularly to a memory system including an apparatus for outputting a plurality of data from a plurality of memory arrays simultaneously.

DESCRIPTION OF THE RELATED ART

A memory system having a "multiple bit line" structure is used, typically, for example, for displaying graphics in a display (e.g., monitor). For a dynamic random access memory (DRAM), currently a 16-bit line structure (an "X16" structure) is used typically, but a 32-bit structure (an "X32" structure) may be desired in the future.

Figure 1:
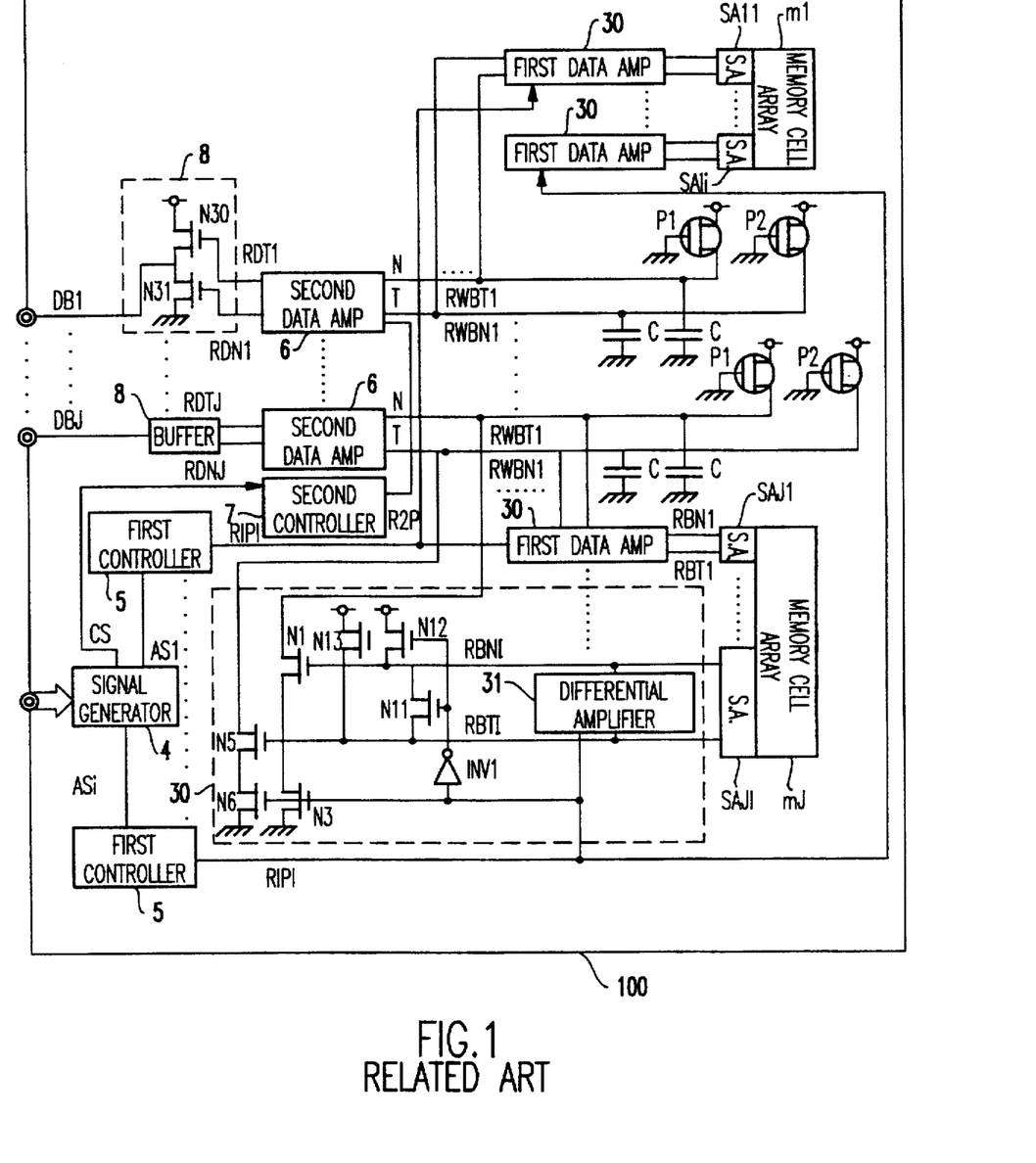
FIG. 1 is a diagram showing a first related memory device.

FIG. 1 shows a conventional (e.g., related art but not prior art) single-chip memory device 100 having a multiple bit line structure. The memory device 100 comprises a plurality of memory cell arrays m1–mJ (where J is an integer greater than 2, and J is 16 in the case of X16, and J is 32 in the case of X32), and each of the memory cell arrays m1–mJ has I (where I is an integer greater than 2) pairs of bit lines. Therefore, sense amplifiers SAj1–SAji (where j and i are integers, and $1<j \leq J$, $1<i \leq I$) are connected respectively to the pairs of bit lines of the memory cell array mj (where j is an integer, and $1<j \leq J$) for amplifying data from the memory cell array mj. For example, sense amplifiers SA11–SA1I are connected respectively to the pairs of bit lines of the memory cell array m1.

Each of the sense amplifiers respectively outputs the amplified data to a corresponding pair of lines RBTi and RBNi (where i is an integer and $1<i \leq I$). For example, sense amplifier SAJ1 outputs a high level signal (e.g., "1") and a low level signal (e.g., "0") respectively to a line RBT1 and a line RBN1.

A plurality of first data amplifiers 30 respectively receive the corresponding signals on the pair of lines RBTi and RBNi, amplify these signals responsive to a corresponding first activation signal R1Pi (where i is an integer, $1<i \leq I$), and output amplified data to a corresponding pair of lines RWBTj and RWBNj (where j is an integer and $1<j \leq J$). Each of the first amplifiers 30 is activated when the corresponding first activation signal R1Pi has an active level (e.g., "1"), and is inactivated when the corresponding first activation signal R1Pi has an inactive level (e.g.,"0").

The pairs of the lines RWBTj and RWBNj are precharged by P-type metal oxide semiconductor (MOS) transistors P1 and P2, and these lines have parasitic capacitances C.

A signal generator 4 receives an address signal from an external device (e.g., an external central processing unit not shown in FIG. 1) of the chip 100, and changes one of a plurality of second activation signals AS1–ASI (where I is an integer greater than 2) to an active level (e.g., "1") from an inactive level (e.g., "0") corresponding to the address signal. The signal generator 4 also changes a third activation signal CS to an active level (e.g., "1") from an inactive level (e.g., "0") when the signal generator 4 receives an address signal.

A plurality of first controllers 5 respectively change a corresponding signal of the first activation signals R1P1–R1PI to an active level (e.g., "1") from an inactive level (e.g., "0") when a corresponding signal of the second activation signals AS1–ASI is changed to an active level from an inactive level.

A plurality of second data amplifiers 6 respectively receive and compare the signals on the corresponding pair of the lines RWBTj and RWBNj, and detect which line of the lines RWBTj and RWBNj has a higher voltage level. Then, the second data amplifier 6 changes the higher voltage level to a first reference voltage (e.g., Vcc) and changes the lower voltage level to a second reference voltage (e.g., ground level).

For example, the second data amplifier 6 changes a voltage level of the line RWBTj to the first reference voltage level (Vcc), and changes a voltage level of the line RWBNj to the second reference voltage level (ground level) if the voltage level of the line RWBTj is higher than that of the line RWBNj when a fourth activation signal R2P has an active level (e.g., "1"). Then, the second data amplifier 6 outputs the first reference voltage level to a line RDTj corresponding to the line RWBTj, and outputs the second reference voltage to a line RDNJ corresponding to the line RWBNj.

A second controller 7 changes the fourth activation signal R2P to an active level (e.g., "1") from an inactive level (e.g., "0") when the third activation signal CS is changed to an active level.

A plurality of buffers 8 respectively comprising N-type MOS transistors N30 and N31, receive the corresponding signals RDTj and RDNj, and output signals DQj (where j is an integer and $1<j \leq J$) to output terminals (unreferenced).

Turning to the first data amplifiers 30, each first data amplifier 30 includes a differential amplifier 31 connected to the pair of lines RBTi and RBNi and which is activated in response to the first activation signal R1Pi. An inverter INV1 inverts the first activation signal R1Pi. An N-type MOS transistor N11 has a source-drain path between the lines RBTi and RBNi, an N-type MOS transistor N12 has a source-drain path between the line RBNi and a first reference voltage (e.g., Vcc), and an N-type MOS transistor N13 has a source-drain path between the line RBTi and the first reference voltage.

A drain of N-type MOS transistor N1 is connected to the line RWBTj. A source of N-type MOS transistor N3 is connected to a second reference voltage (e.g., ground) and a drain of the MOS transistor N3 is connected to a source of the transistor N1.

A drain of N-type MOS transistor N5 is connected to the line RWBNj. A source of N-type MOS transistor N6 is connected to the second reference voltage and a drain of the MOS transistor N6 is connected to a source of the transistor N5.

Gates of the MOS transistors N11, N12 and N13 are connected to an output of the inverter INV1. Gates of the MOS transistors N3 and N6 are connected to an input of the inverter INV1. A gate of the MOS transistor N1 is connected to the line RBNi, and a gate of the MOS transistor N5 is connected to the line RBTi.

Figure 2:
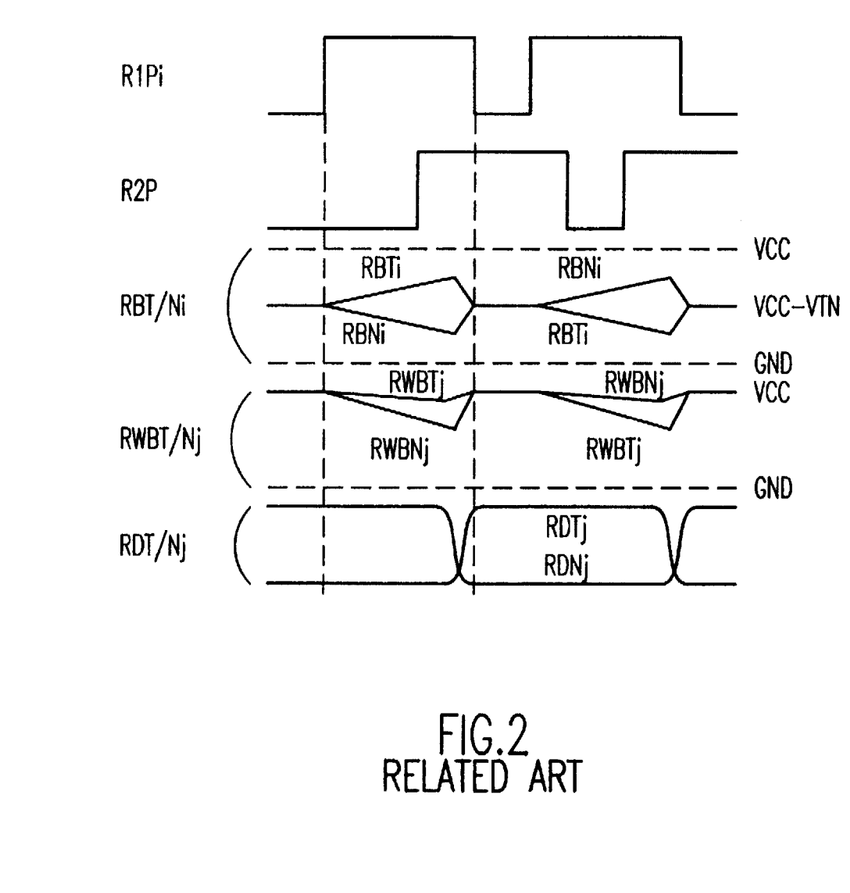
FIG. 2 is a timing chart showing timings of signals in the device 100 of FIG. 1.

FIG. 2 is a timing chart for explaining an operation of reading data from memory cell arrays m1–mJ.

First, the pairs of lines RWBTj and RWBNj are precharged to a first voltage level of Vcc and the pairs of lines RBTi and RBNi are precharged to a second voltage level (Vcc–VTN). VTN is a threshold voltage level of the MOS transistors N12 and N13.

When the signal generator 4 receives an address signal, the signal generator 4 changes a corresponding signal of the second activation signals AS1–ASI to an active level. In this example, a second activation signal AS1 is changed to an active level. Therefore, first controller 5 changes a first activation signal R1P1 to an active level, as shown in FIG. 2.

The memory cell arrays m1–mJ also receive respectively the address signal (not shown in FIG. 1) and output corresponding data. Therefore, sense amplifiers SA11–SAJ1 respectively amplify corresponding data and output the data to corresponding pairs of lines RBT1 and RBN1.

First data amplifiers 30 connected to the pairs of lines RBT1 and RBN1 are activated because the first activating signal R1P1 is changed to an active level. Therefore, first data amplifiers 30 respectively output amplified data to the corresponding pair of lines RWBTj and RWBNj, as shown in FIG. 2.

The second controller 7 changes the fourth activation signal R2P to an active level, as shown in FIG. 2, because the signal generator 4 changes the third activation signal CS to an active level. Therefore, the second data amplifiers 6 respectively are activated, amplify the data on the corresponding pair of lines RWBTj and RWBNj, and output data to corresponding pairs of lines RDTj and RDNj, as shown in FIG. 2.

Therefore, the memory device 100 outputs J (where J is 16 for an "X16" structure) data simultaneously when the device 100 receives an address signal.

However, the number of lines RWBT1–RWBTJ and RWBN1–RWBNJ is (2×J), which is two times larger than J which is the number of output data of the device 100. Therefore, it is difficult to make the device 100 smaller and more compact.

Figure 3:
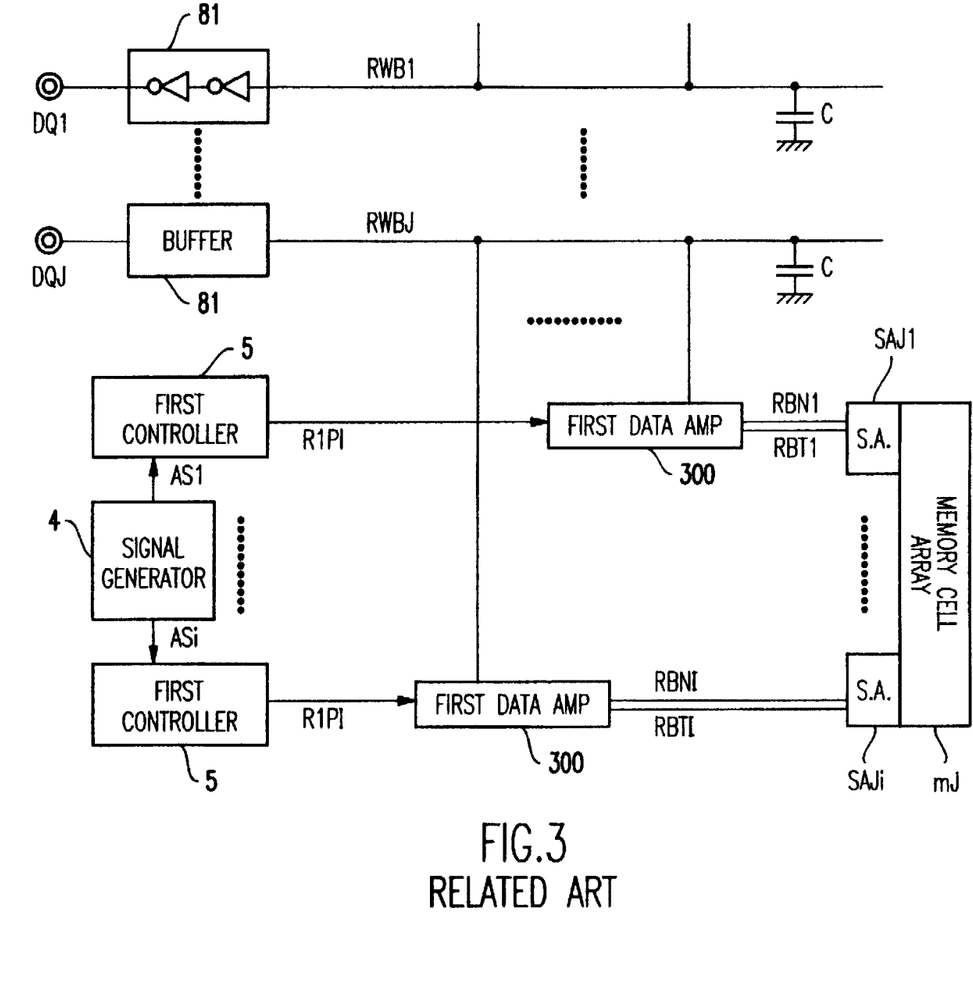
FIG. 3 is a diagram showing a second related memory device.

In contrast to the above first conventional device, the number of lines may be decreased if an access speed is unimportant. For example, FIG. 3 shows another conventional (e.g., related art but not prior art) single-chip memory device having a decreased number of lines compared to the first conventional device. The same parts in FIG. 3 as those in FIG. 1 are numbered with the same reference numerals in FIG. 1 and, for brevity, explanation of these parts are omitted from the following description.

In this device, first data amplifiers 300 are activated when a corresponding first activation signal R1Pi is changed to an active level, amplify data on a corresponding pair of lines RBTi and RBNi, and output amplified data to a corresponding line RWBj. With this construction, the number of lines RWB1–RWBJ is half of the number of lines of the device shown in FIG. 1.

Figure 4:
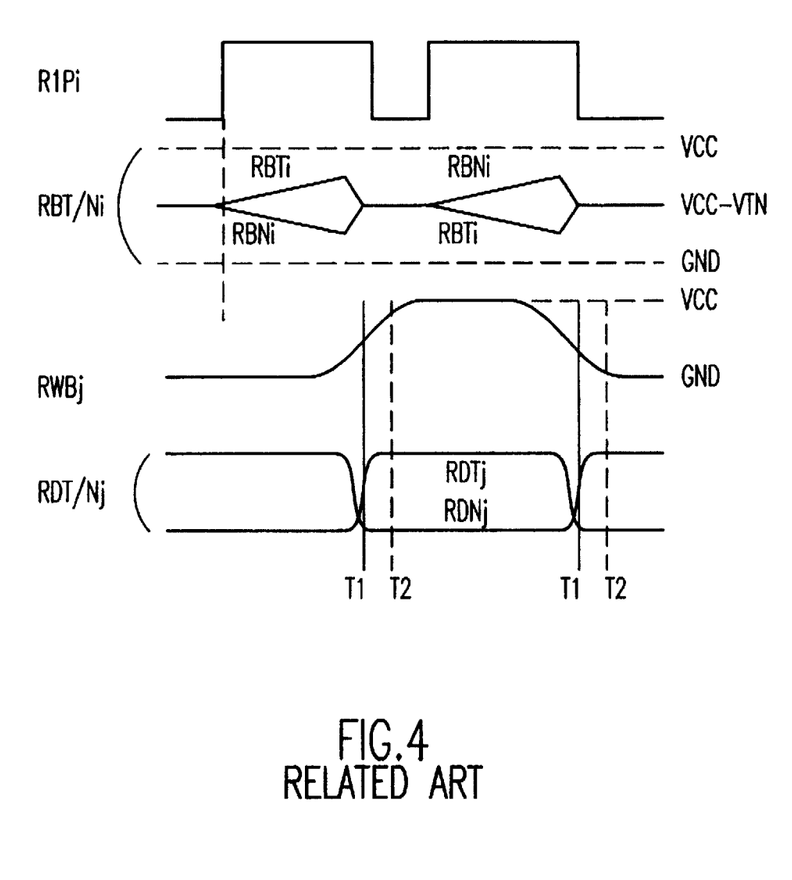
FIG. 4 is a timing chart showing timings of signals in the device of FIG. 3.

However, as shown in FIG. 4, a relatively long time is required to charge a corresponding line RWBj because the first data amplifier must change the level of the line RWBj from ground level to the first voltage level of Vcc. Therefore, access timing T2 is later than the timing T1 of the device 100 shown in FIG. 1.

Thus, both of the above conventional systems have problems. Specifically, the first conventional system has adequate access speed, but is large and bulky. The second conventional system is smaller and more compact, but has a poor access speed.

SUMMARY OF THE INVENTION

In view of the foregoing problems of the conventional memory systems, it is therefore an object of the present invention to provide an improved memory system having a "multiple bit line" structure.

It is another object of the present invention to provide an improved amplifier for amplifying data from memory cell arrays.

It is a further object of the present invention to provide an arrangement of an amplifier amplifying data from memory arrays and a controller for activating the amplifier.

In a first aspect, a memory system according to the present invention includes a plurality of memory cell arrays including a plurality of pairs of bit lines, a plurality of first bus lines corresponding to the plurality of memory cell arrays, a plurality of first data amplifiers for respectively amplifying data of corresponding pairs of bit lines and for outputting an amplified data to corresponding ones of the first bus lines, a reference voltage circuit for outputting a reference voltage level to a reference bus line, and a plurality of second data amplifiers, connected to corresponding ones of the first bus lines and the reference bus line, for receiving an output of the corresponding first data amplifier and the reference voltage level, for judging which voltage level is higher between the output of the corresponding first data amplifier and the reference voltage level, and for amplifying the voltage level being higher.

With the unique and unobvious structure of the present invention, all of the second data amplifiers receive an output of the reference voltage circuit. Therefore, the number of bus lines can be decreased and the system size can be made smaller, as compared to the conventional memory system. Further, the memory system of the present invention can output data faster because the second data amplifier compares voltage levels of the outputs of the reference voltage circuit and the first data amplifier with one another. Therefore, an output of the first data amplifier need not be changed from ground level to the first voltage level of Vcc, and it can have a small amplitude.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 5:
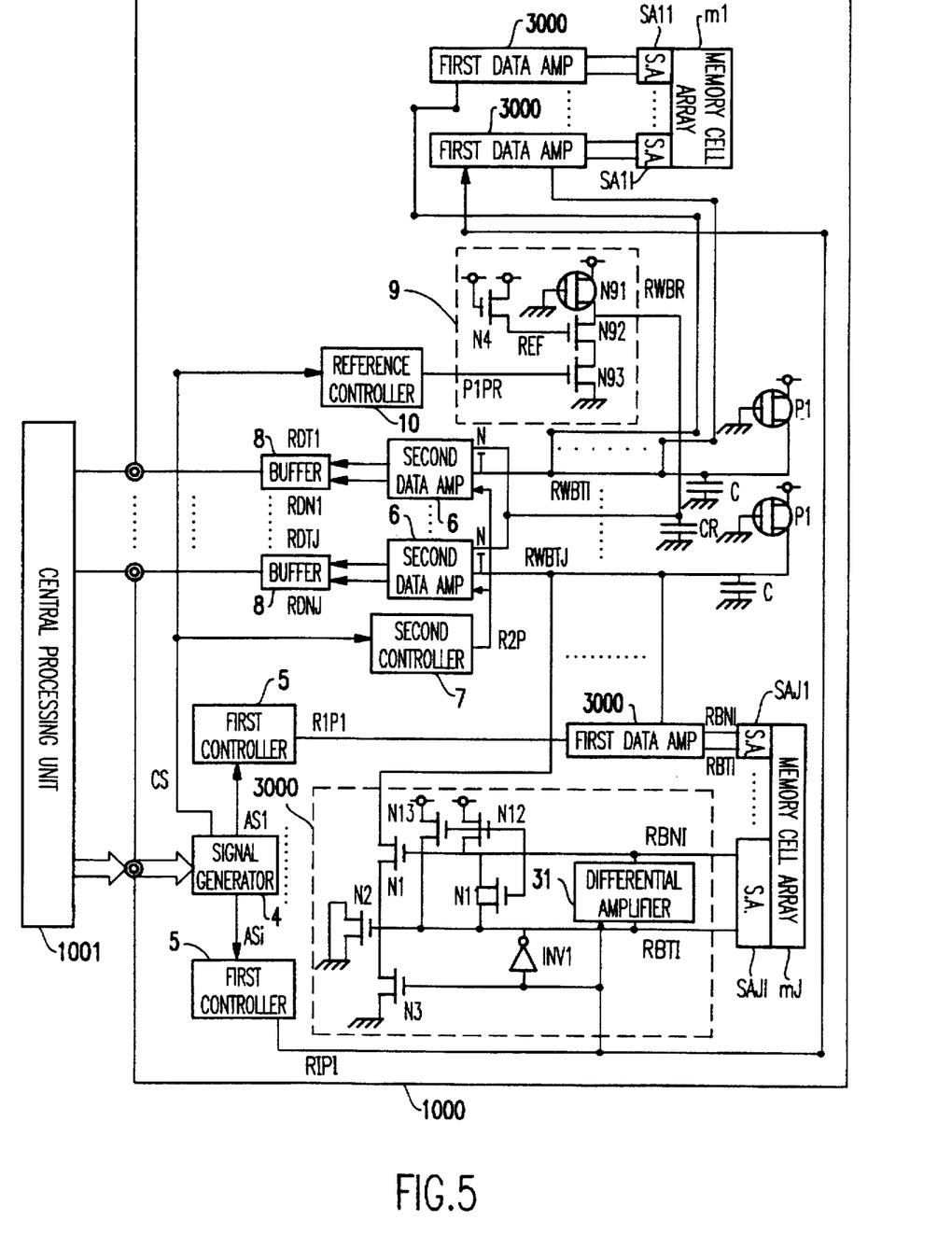
FIG. 5 is a diagram showing a memory system 1000 according to the present invention.

Referring now to the drawings, and more particularly to FIG. 5, a single-chip semiconductor memory system has a "multiple bit line" structure according to a first embodiment of the present invention. The same parts in FIG. 5 as those in FIG. 1 are numbered with the same reference numerals in FIG. 1 and, for brevity, explanations of these parts are omitted from the following description.

FIG. 5 shows a single-chip memory device 1000 and an external central processing unit (CPU) 1001 for controlling the memory device 1000. The CPU 1001 outputs an address signal and executes an instruction using data from the device 1000.

The memory device 1000 comprises a plurality of first data amplifiers 3000 respectively for receiving the signals on a corresponding pair of lines RBTi and RBNi, amplifying these signals responsive to a corresponding first activation signal R1Pi (where i is an integer and $1<i \leq I$) outputted by a first controller 5 discussed in further detail below, and outputting amplified data to a corresponding line RWBTj (where j is an integer and $1<j \leq J$).

The lines RWBT1–RWBTJ are precharged by P-type MOS transistor P1, and these lines have parasitic capacitances C. A line RWBR is connected to each of the second data amplifiers 6 instead of the lines RWBN1–RWBNJ, as shown in FIG. 1. As described below, such connection allows second data amplifiers 6 to compare the voltage levels of the outputs of the first data amplifiers 3000 with the outputs of a reference voltage circuit 9 to speed operation.

The reference circuit 9 changes a signal on a line RWBR to a third reference voltage level when a fifth activation signal R1PR has an active level (e.g., "1") from an inactive level (e.g., "0").

The reference circuit 9 comprises a P-type MOS transistor N91 having a source-drain path between the first reference voltage (e.g., Vcc) and the line RWBR and the gate is connected to the second reference voltage (e.g., ground level). A drain of an N-type MOS transistor N92 is connected to the line RWBR, and a drain of an N-type MOS transistor N93 is connected to a source of the MOS transistor N92. A source of the MOS transistor N93 is connected to the second reference voltage. An N-type MOS transistor N4 has a source-drain path between the first reference voltage and a gate of the MOS transistor N92, and a gate of the MOS transistor N4 is connected to the first reference voltage. A gate of the MOS transistor N93 is connected to the line R1PR.

A reference controller 10 changes the fifth activation signal R1PR to an active level (e.g., "1") from an inactive level (e.g., "0") when the third activation signal CS changes to an active level.

Each of the first data amplifiers 3000 is activated when the corresponding first activation signal R1Pi has an active level (e.g., "1"), and is inactivated when the corresponding first activation signal R1Pi has an inactive level (e.g., "0").

Each first data amplifier 3000 includes differential amplifier 31 connected to the pair of lines RBTi and RBNi and which is activated in response to the corresponding first activation signal R1Pi. An inverter INV1 inverts the corresponding first activation signal R1Pi. An N-type MOS transistor N11 has a source-drain path between the lines RBTi and RBNi, an N-type MOS transistor N12 has a source-drain path between the line RBNi and a first reference voltage (e.g., Vcc), and an N-type MOS transistor N13 has a source-drain path between the line RBTi and the first reference voltage.

A drain of N-type MOS transistor N1 is connected to the corresponding line RWBTj. A source of N-type MOS transistor N3 is connected to a second reference voltage (e.g., ground level) and a drain of the MOS transistor N3 is connected to a source of the transistor N1.

A drain and a source of N-type MOS transistor N2 are connected to the second reference voltage. Gates of the MOS transistors N11, N12 and N13 are connected to an output of the inverter INV1. A gate of the MOS transistors N3 is connected to an input of the inverter INV1. A gate of the MOS transistor N2 is connected to the corresponding line RBTi, and a gate of the MOS transistor N1 is connected to the corresponding line RBNi. The MOS transistor N2 is used to adjust parasitic capacitances between the line RBNi and the line RBTi.

Figure 6:
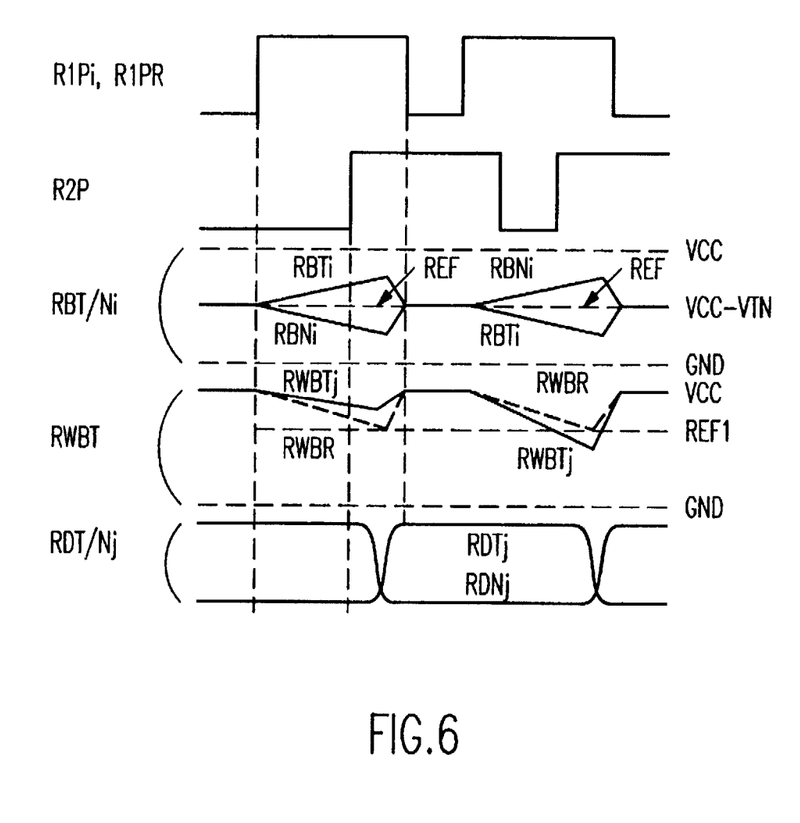
FIG. 6 is a timing chart showing timings of signals in device 1000 of FIG. 5 according to the present invention.

FIG. 6 is a timing chart for explaining an operation of reading data from memory cell arrays m1–mJ.

First, the lines RBWT1–RWBTJ are precharged to a voltage level of Vcc, and the pairs of lines RBTi and RBNi are precharged to a voltage level (Vcc–VTN). VTN is a threshold voltage level of the MOS transistors N12 and N13.

When the signal generator 4 receives an address signal, the signal generator 4 changes a corresponding signal of the second activation signals AS1–ASI to an active level. In this example, a second activation signal AS1 is changed to an active level, but of course different (e.g., opposite) logic could be employed with suitable modification, as would be known by one of ordinary skill in the art taking the present specification as a whole. Therefore, first controller 5 changes (and outputs) a first activation signal R1P1 to an active level, as shown in FIG. 6. At this time, the reference controller 10 changes (and outputs) the fifth activation signal R1PR to an active level synchronizing with a first activation signal R1P1, as shown in FIG. 6.

The memory cell arrays m1–mJ also receive respectively the address signal (not shown in FIG. 5) and output corresponding data. For example, the data is a pair of "True" (e.g., "1") and "Not" (e.g., "0") data. Therefore, sense amplifiers SA11–SAJ1 respectively amplify corresponding data and output the data to corresponding pairs of lines RBT1 and RBN1.

First data amplifiers 3000, connected to the pairs of lines RBT1 and RBN1, are activated because the first activating signal R1P1 is changed to an active level. Therefore, first data amplifiers 3000 respectively output amplified data to the corresponding line RWBTj, as shown in FIG. 6.

The second controller 7 changes (and outputs) the fourth activation signal R2P to an active level, as shown in FIG. 6, because the signal generator 4 changes the third activation signal CS (not shown in FIG. 6) to an active level. Therefore, the second data amplifiers 6 respectively are activated, amplify the data on the corresponding pair of lines RWBTj and RWBR, and output data to a corresponding pair of lines RDTj and RDNj, as shown in FIG. 6.

Therefore, the memory device 1000 outputs J (where J is 16 for an "X16" structure) data simultaneously when the device receives an address signal from the CPU 1001.

In this embodiment, the differential amplifier 31 is designed so that the balance voltage level REF of the pair of lines RBTi and RBNi becomes an intermediate voltage level between the pair of lines RBTi and RBNi when differential amplifier 31 is activated.

As described above, the chip 1000 has about half the number of lines as that of the related art device shown in FIG. 1. Therefore, the chip can be made smaller than the related art device shown in FIG. 1.

Moreover, data can be output faster than that of the related art system shown in FIG. 3, because the first data amplifiers 3000 can output a signal having a small amplitude and do not have to output a signal having a large amplitude from ground to Vcc, as in the system of FIG. 3.

Further, the device 1000 has low noise because the reference circuit 9 has a similar construction to the first data amplifier 3000. For example, if the line RWBR were connected to some reference voltage, the voltage level of the line RWBR would change when noise occurs. Therefore, in such a case, the second data amplifier 6 might recognize erroneously that the signal on the line RWBTj is "True" when the signal is in fact "Not". However, the voltage levels of the line RWBTj and the line RWBR in the first embodiment of the present invention are shifted similarly because the reference circuit 9 has a similar construction to the first data amplifier 3000. Therefore, the second data amplifier 6 recognizes the level of the line RWBTj correctly.

Figure 7:
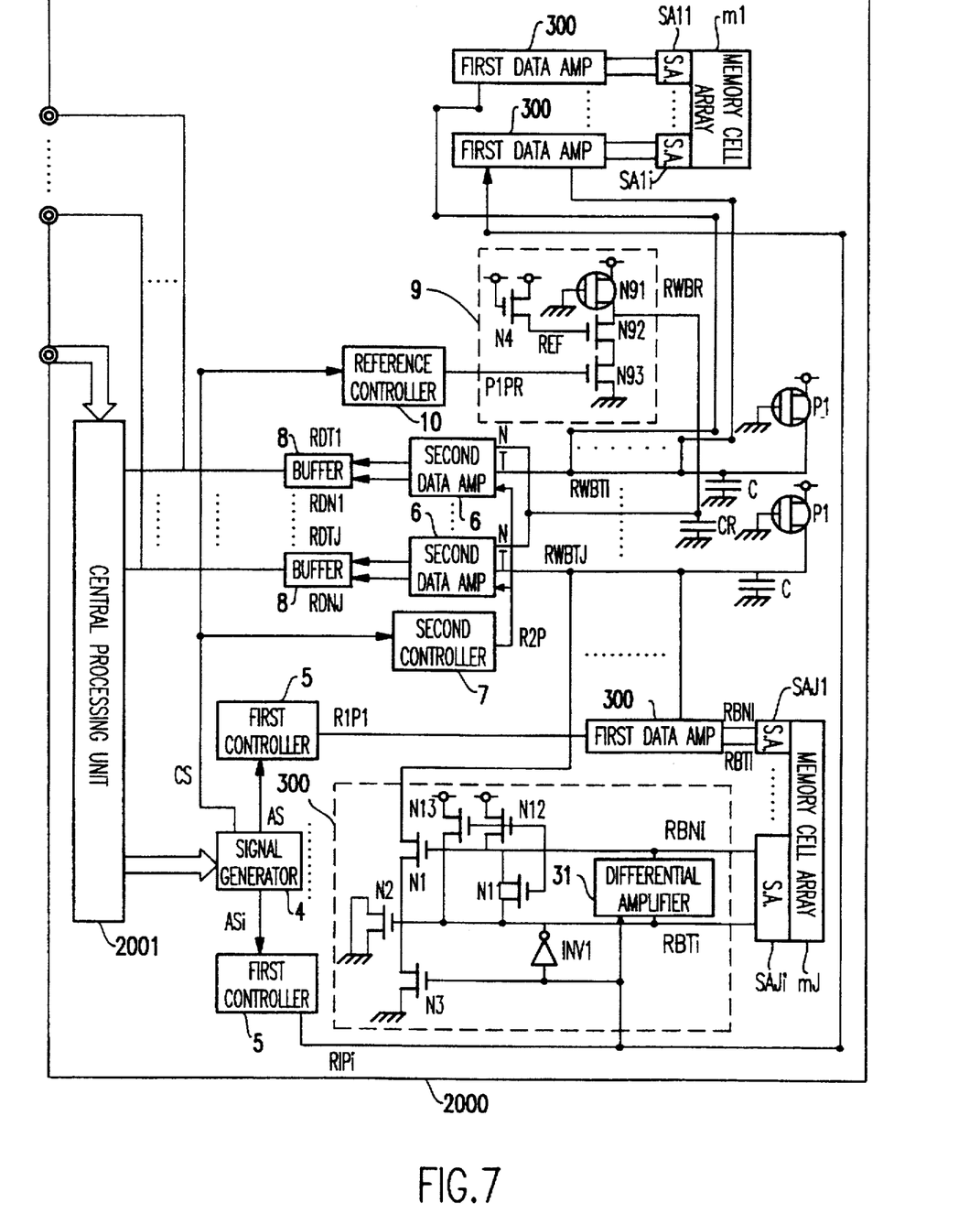
FIG. 7 is a diagram showing a memory system containing a central processing unit (CPU) on a single-chip 2000 according to the present invention.

FIG. 7 shows a single-chip memory system 2000 including an on-board CPU 2001. The CPU 2001 receives instructions from an input terminal (unreferenced), and executes the instructions by using data from a plurality of buffers 8. The CPU 2001 outputs an address signal to the signal generator 4 and a plurality of memory cell arrays m1–mJ. In the first embodiment of the present invention, the chip 2000 outputs data of a plurality of buffers 8 to an external device of the chip 2000 by using a plurality of terminals (unreferenced).

Figure 8:
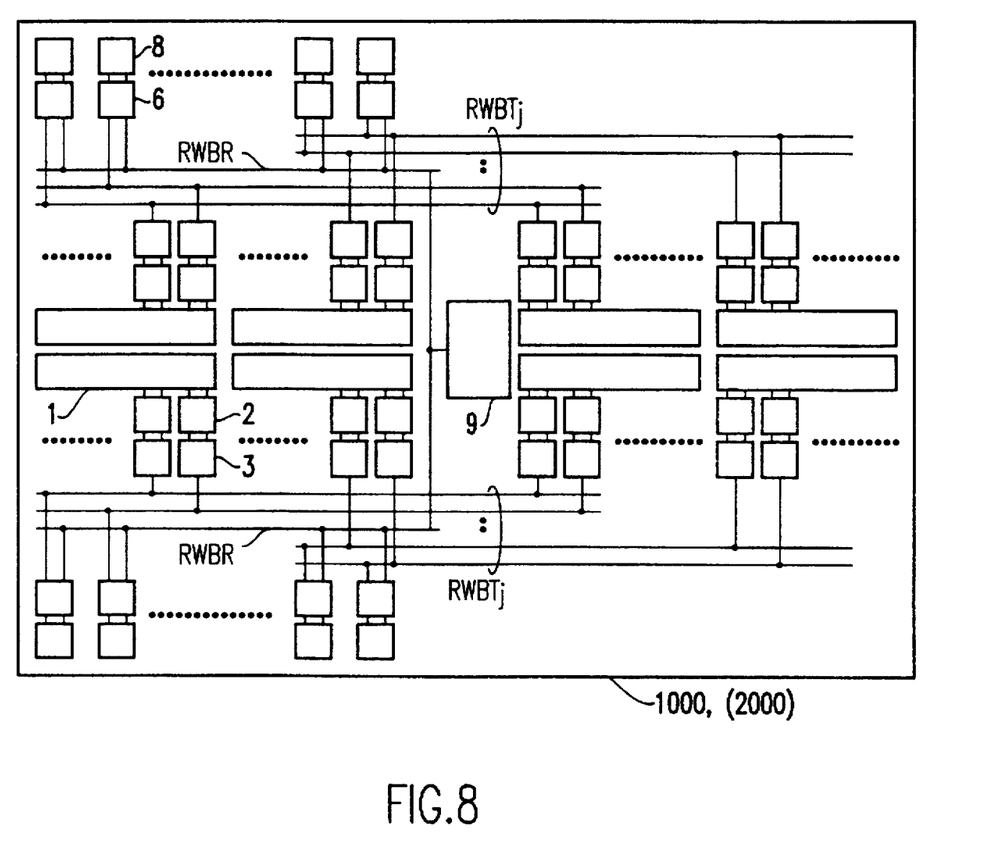
FIG. 8 is a circuit diagram showing a first arrangement of an apparatus on the single-chip 1000 (2000) according to the present invention.

FIG. 8 shows an arrangement of the "X16" structure employable on either the chip 1000 or 2000. Typically, in related structures a "mirror" structure is formed in which eight buffers 8 are positioned at a first side and the other eight buffers 8 are positioned at a second side, as shown in FIG. 8.

However, in this case, line RWBR is longer than line RWBTj. Therefore, a parasitic capacitance CR of the line RWBR is larger than a parasitic capacitance C of the line RWBTj. Thus, a relatively long time is needed to change the line RWBR to the reference level REF1 if the parasitic capacitance CR is larger than the parasitic capacitance C. Therefore, in this case, the arrangement of FIG. 8 preferably should be redesigned.

Figure 9:
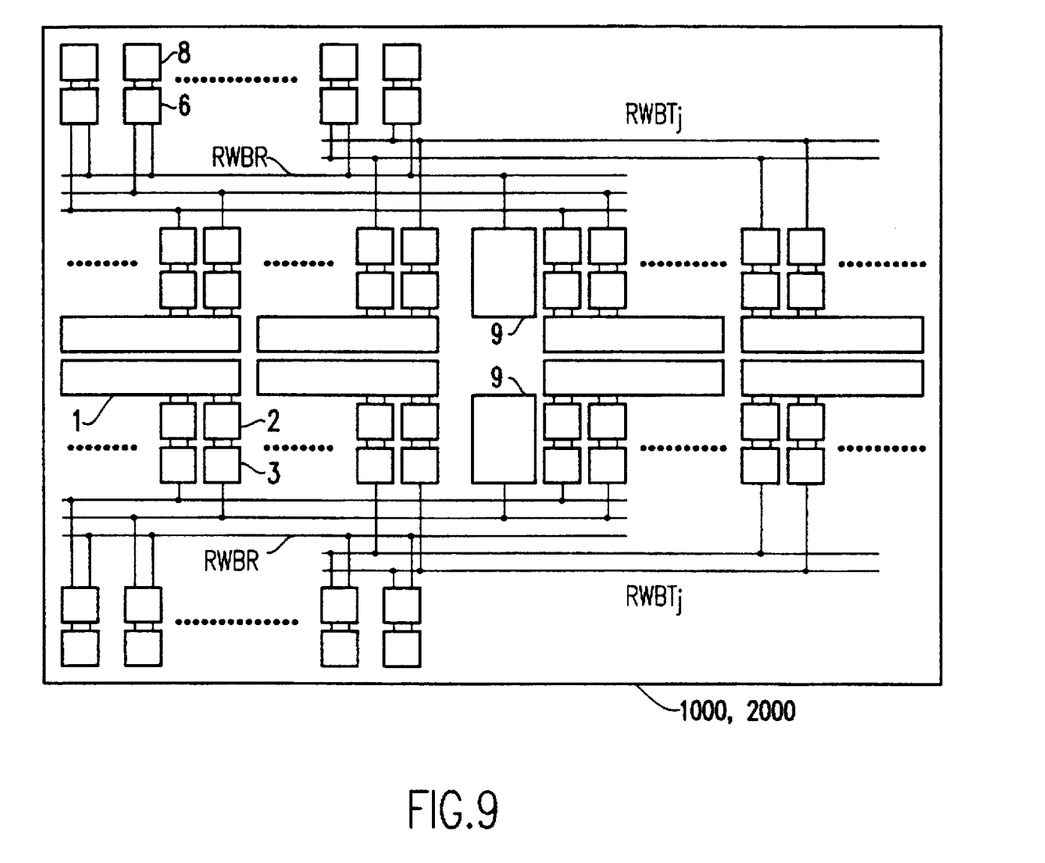
FIG. 9 is a circuit diagram showing a second arrangement of an apparatus on the single-chip 1000 (2000) according to the present invention.

FIG. 9 shows another arrangement of the "X16" structure employable either on chip 1000 or 2000 including a reference circuit 9. In this case, instead of a single reference circuit 9 provided in FIG. 8, two reference circuits 9 are provided on the chip 1000 (or 2000) to shorten the line RWBR. Therefore, the lines RWBT1–RWBTJ and the lines RWBR have the same length, and parasitic capacitances CR and C have the same value. Thus, a device having the arrangement of FIG. 9 can output data faster than a device having the arrangement of FIG. 8.

As mentioned above, J and I depend on the memory system design. Thus, J could be sixteen for an "X16" structure, but alternatively it could be thirty-two for an "X32" structure.

With the unique and unobvious structure of the present invention, all of the second data amplifiers receive an output of the reference voltage circuit. Therefore, the number of bus lines can be decreased and the system size can be made smaller, as compared to the conventional (related art) memory systems.

Further, the memory system of the present invention can output data faster, because the second data amplifier compares voltage levels of the outputs of the reference voltage circuit and the first data amplifier with one another. Therefore, an output of the first data amplifier need not be changed from ground level to the first voltage level of Vcc, and it can have a small amplitude.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory system comprising:

a plurality of memory cell arrays including a plurality of pairs of bit lines;

a plurality of first bus lines corresponding to said plurality of memory cell arrays;

a plurality of first data amplifiers for respectively amplifying data of said corresponding pairs of bit lines, and for outputting an amplified data to corresponding ones of said first bus lines;

a plurality of second data amplifiers respectively connected to corresponding ones of said first bus lines; and a reference voltage circuit for outputting a reference voltage level to a reference bus line, said reference bus line being coupled to said plurality of second data amplifiers, said second data amplifiers for receiving an output of a corresponding first data amplifier and the reference voltage level, for judging which voltage level is higher between the output of said corresponding first data amplifier and the reference voltage level, and for amplifying the voltage level being higher.

2. The memory system as recited in claim 1, wherein each of said first bus lines and the reference bus line have a same length.

3. The memory system as recited in claim 2, further comprising:

a signal generator for changing one of a plurality of first activation signals to an active level from an inactive level corresponding to an address signal; and a plurality of first controllers, coupled to said signal generator and corresponding to said first data amplifiers, for activating a corresponding one of said first data amplifiers responsive to a corresponding first activation signal having an active level, and for inactivating the corresponding one of said first data amplifiers responsive to the first activation signal having an inactive level.

4. The memory system as recited in claim 3, wherein said signal generator outputs a second activation signal, and changes the second activation signal to an active level from an inactive level, thereby activating said reference voltage circuit and said second data amplifiers, responsive to said address signal.

5. The memory system as recited in claim 4, further comprising:

a second controller for activating all of said second data amplifiers responsive to the second activation signal having an active level, and for inactivating all of said second data amplifiers responsive to the second activation signal having an inactive level; and a reference controller for activating said reference voltage circuit responsive to the second activation signal having an active level, and for inactivating said reference voltage circuit responsive to the second activation signal having an inactive level.

6. The memory system as recited in claim 5, wherein said plurality of first controllers respectively output a third activation signal, and change the third activation signal to an active level from an inactive level for activating said corresponding first data amplifier when the corresponding first activation signal has an active level.

7. The memory system as recited in claim 6, wherein each of said first data amplifiers comprises:

a differential amplifier, connected to a corresponding pair of bit lines, for amplifying data of the pair of bit lines when the corresponding first activation signal has an active level;

an inverter for inverting the corresponding third activation signal;

a first metal oxide semiconductor (MOS) transistor having a source-drain path between the pair of bit lines;

a second MOS transistor having a source-drain path between one of the pair of bit lines and a first reference voltage;

a third MOS transistor having a source-drain path between another of the pair of bit lines and the first reference voltage;

a fourth MOS transistor having a drain connected to said corresponding second data amplifier;

a fifth MOS transistor having a source connected to a second reference voltage and a drain connected to a source of the fourth MOS transistor;

a sixth MOS transistor having a source and a drain connected to the second reference voltage, and wherein gates of said first, second and third MOS transistors are connected to an output of said inverter, a gate of said fifth MOS transistor receives the corresponding third activation signal, a gate of said sixth MOS transistor is connected to the another of the pair of bit lines, and a gate of said fourth MOS transistor is connected to the one of the pair of bit lines.

8. The memory system as recited in claim 7, wherein said reference controller outputs a fourth activation signal, and changes the fourth activation signal to an active level from an inactive level for activating said reference voltage circuit when the second activation signal has an active level.

9. The memory system as recited in claim 8, wherein said reference voltage circuit comprises:

a seventh MOS transistor having a source-drain path between the first reference voltage and a node for outputting the reference voltage level, and a gate connected to the second reference voltage;

an eighth MOS transistor having a drain connected to the node;

a ninth MOS transistor having a drain connected to a source of said eighth MOS transistor, a source connected to the second reference voltage, and a gate which receives the fourth activation signal; and a tenth MOS transistor having a source-drain path between the first reference voltage and a gate of said eighth MOS transistor, and a gate connected to the first reference voltage.

10. The memory system as recited in claim 9, wherein said first, second, third, fourth, fifth, sixth, eighth, ninth and tenth MOS transistors comprise first conductivity-type transistors, and said seventh MOS transistor comprises a second conductivity-type transistor.

11. The memory system as recited in claim 10, wherein said first conductivity-type transistors comprise N-type MOS transistors, and said second conductivity-type transistor comprises a P-type MOS transistor.

12. The memory system as recited in claim 11, wherein the memory system is formed on a single semiconductor chip.

13. The memory system as recited in claim 1, wherein the memory system is formed on a single semiconductor chip.

14. The memory system as recited in claim 12, wherein the memory system is operated by an off-chip central processing unit (CPU).

15. The memory system as recited in claim 13, wherein the memory system is operated by an off-chip central processing unit (CPU).

16. The memory system as recited in claim 12, further comprising a central processing unit (CPU) on said single semiconductor chip.

17. The memory system as recited in claim 13, further comprising a central processing unit (CPU) on said single semiconductor chip.

18. A memory system comprising:

a memory cell array including a plurality of pairs of bit lines;

a plurality of first data amplifiers for amplifying data of corresponding ones of said pairs of bit lines;

a reference voltage circuit, operatively coupled to said first data amplifiers, for outputting a reference voltage level; and a second data amplifier for receiving an output of a corresponding first data amplifier and the reference voltage level, for judging which voltage level is higher between the output of said corresponding first data amplifier and the reference voltage level, and for amplifying the voltage level being higher.

19. The memory system as recited in claim 18, further comprising:

a signal generator for changing one of a plurality of first activation signals to an active level from an inactive level corresponding to an address signal; and a plurality of first controllers, coupled to said signal generator and corresponding to said first data amplifiers, for activating a corresponding one of said first data amplifiers responsive to the first activation signal having an active level, and for inactivating the corresponding one of said first data amplifiers responsive to the first activation signal having an inactive level.

20. The memory system as recited in claim 19, wherein said signal generator outputs a second activation signal, and changes the second activation signal to an active level from an inactive level, thereby activating said reference voltage circuit and said second data amplifiers, responsive to the address signal.

21. The memory system as recited in claim 20, further comprising:

a second controller for activating all of said second data amplifiers responsive to the second activation signal having an active level, and for inactivating all of said second data amplifiers responsive to the second activation signal having an inactive level; and a reference controller for activating said reference voltage circuit when the second activation signal has an active level, and for inactivating said reference voltage circuit when the second activation signal has an inactive level.

22. The memory system as recited in claim 21, wherein said plurality of first controllers respectively output a third activation signal, and change the third activation signal to an active level from an inactive level for activating said corresponding first data amplifier when the corresponding first activation signal has an active level.

23. The memory system as recited in claim 22, wherein each of said first data amplifiers comprises:

a differential amplifier, connected to a corresponding pair of bit lines, for amplifying data of the pair of bit lines when the corresponding first activation signal has an active level;

an inverter for inverting the corresponding third activation signal;

a first metal oxide semiconductor (MOS) transistor having a source-drain path between the pair of bit lines;

a second MOS transistor having a source-drain path between one of the pair of bit lines and a first reference voltage;

a third MOS transistor having a source-drain path between another of the pair of bit lines and the first reference voltage;

a fourth MOS transistor having a drain connected to said corresponding second data amplifier;

a fifth MOS transistor having a source connected to a second reference voltage and a drain connected to a source of the fourth MOS transistor;

a sixth MOS transistor having a source and a drain connected to the second reference voltage, and wherein gates of said first, second and third MOS transistors are connected to an output of said inverter, a gate of said fifth MOS transistor receives the corresponding third activation signal, a gate of said sixth MOS transistor is connected to the another of the pair of bit lines, and a gate of said fourth MOS transistor is connected to the one of the pair of bit lines.

24. The memory system as recited in claim 23, wherein said reference controller outputs a fourth activation signal, and changes the fourth activation signal to an active level from an inactive level for activating said reference voltage circuit when the second activation signal has an active level.

25. The memory system as recited in claim 24, wherein said reference voltage circuit comprises:

a seventh MOS transistor having a source-drain path between the first reference voltage and a node for outputting the reference voltage level, and a gate connected to the second reference voltage;

an eighth MOS transistor having a drain connected to the node;

a ninth MOS transistor having a drain connected to a source of said eighth MOS transistor, a source connected to the second reference voltage, and a gate which receives the fourth activation signal; and a tenth MOS transistor having a source-drain path between the first reference voltage and a gate of said eighth MOS transistor, and a gate connected to the first reference voltage.

26. The memory system as recited in claim 25, wherein said first, second, third, fourth, fifth, sixth, eighth, ninth and tenth MOS transistors comprise first conductivity-type transistors, and said seventh MOS transistor comprises a second conductivity-type transistor.

27. The memory system as recited in claim 26, wherein said first conductivity-type transistors comprise N-type MOS transistors, and said second conductivity type transistor comprises a P-type MOS transistor.

* * * * *